United States Patent
Hammerschmidt et al.

(10) Patent No.: US 10,802,133 B2
(45) Date of Patent: Oct. 13, 2020

(54) DIVERSE SENSING USING DIFFERENT TYPES OF SENSORS

(71) Applicant: Infineon Technologies AG, Neubiberg (DE)

(72) Inventors: Dirk Hammerschmidt, Finkenstein (AT); Robert Hermann, Voelkermarkt (AT)

(73) Assignee: Infineon Technologies AG, Neubiberg (DE)

( * ) Notice: Subject to any disclaimer, the term of this patent is extended or adjusted under 35 U.S.C. 154(b) by 330 days.

(21) Appl. No.: 15/982,908

(22) Filed: May 17, 2018

(65) Prior Publication Data
US 2019/0353773 A1    Nov. 21, 2019

(51) Int. Cl.
| | | |
|---|---|---|
| G01B 7/14 | (2006.01) | |
| G01B 7/30 | (2006.01) | |
| G01R 33/02 | (2006.01) | |
| G01S 13/86 | (2006.01) | |
| G01N 27/72 | (2006.01) | |
| G01B 7/00 | (2006.01) | |
| G01N 22/00 | (2006.01) | |
| G01B 15/02 | (2006.01) | |
| G01S 11/12 | (2006.01) | |
| G01D 5/14 | (2006.01) | |
| G01D 5/12 | (2006.01) | |
| G01D 5/20 | (2006.01) | |
| G01B 7/02 | (2006.01) | |

(52) U.S. Cl.
CPC ............... *G01S 13/86* (2013.01); *G01B 7/00* (2013.01); *G01B 15/02* (2013.01); *G01D 5/12* (2013.01); *G01D 5/145* (2013.01); *G01D 5/147* (2013.01); *G01D 5/2013* (2013.01); *G01N 22/00* (2013.01); *G01N 27/72* (2013.01); *G01S 11/12* (2013.01); *G01B 7/003* (2013.01); *G01B 7/02* (2013.01); *G01B 7/14* (2013.01); *G01B 7/30* (2013.01)

(58) Field of Classification Search
CPC .......... G01D 5/145; G01D 5/12; G01D 5/147; G01D 5/2013; G01B 7/30; G01B 7/14; G01B 7/003; G01B 7/02
USPC ..... 324/51, 55, 200, 207.11, 207.13, 207.14, 324/207.23
See application file for complete search history.

(56) References Cited

U.S. PATENT DOCUMENTS

| | | | |
|---|---|---|---|
| 2015/0022192 A1* | 1/2015 | Ausserlechner | G01B 7/30 324/207.25 |
| 2019/0226877 A1* | 7/2019 | Kluge | G01D 5/2053 |
| 2019/0317120 A1* | 10/2019 | Fontanesi | G01P 3/487 |

* cited by examiner

*Primary Examiner* — Raul J Rios Russo
(74) *Attorney, Agent, or Firm* — Harrity & Harrity, LLP

(57) ABSTRACT

A system may include a magnetic sensor to measure a magnetic field that is influenced by a magnetic property of a target object, and determine first characteristic information, associated with the target object, based on the magnetic field. The system may include a radar sensor to measure a radar signal that is influenced by a radar property of the target object, and determine second characteristic information, associated with the target object, based on the radar signal. The system may include a controller to determine a characteristic of the target object based on the first characteristic information and the second characteristic information.

20 Claims, 12 Drawing Sheets

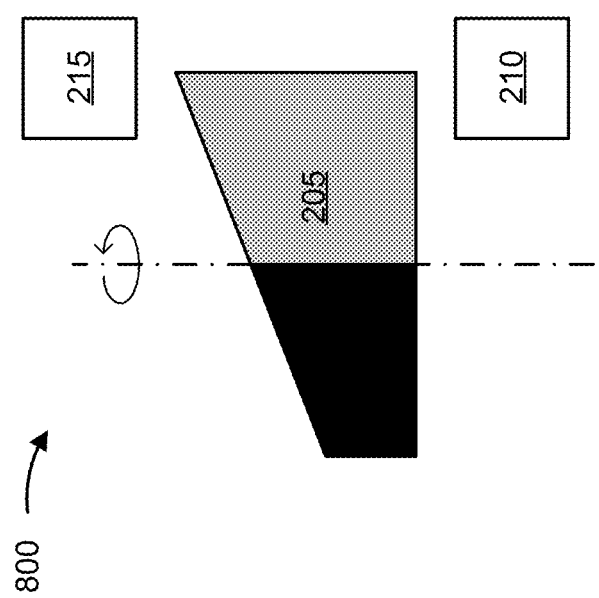

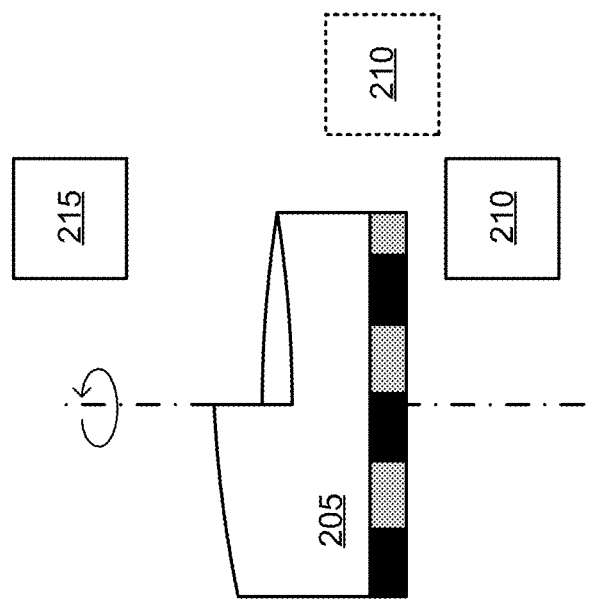
FIG. 9B
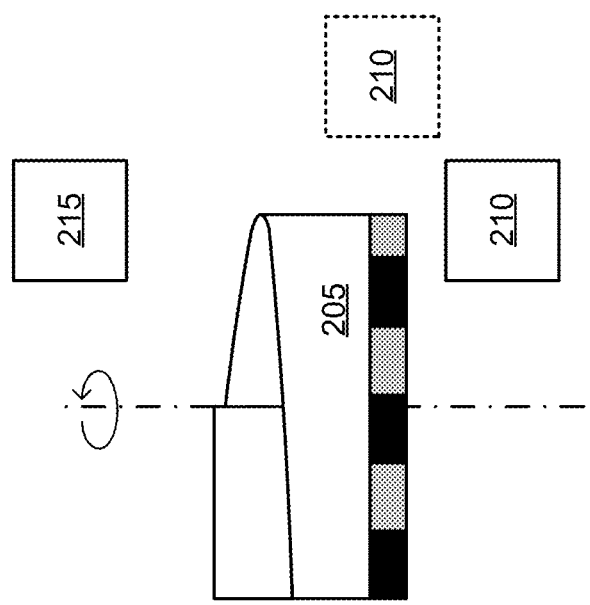
FIG. 9A

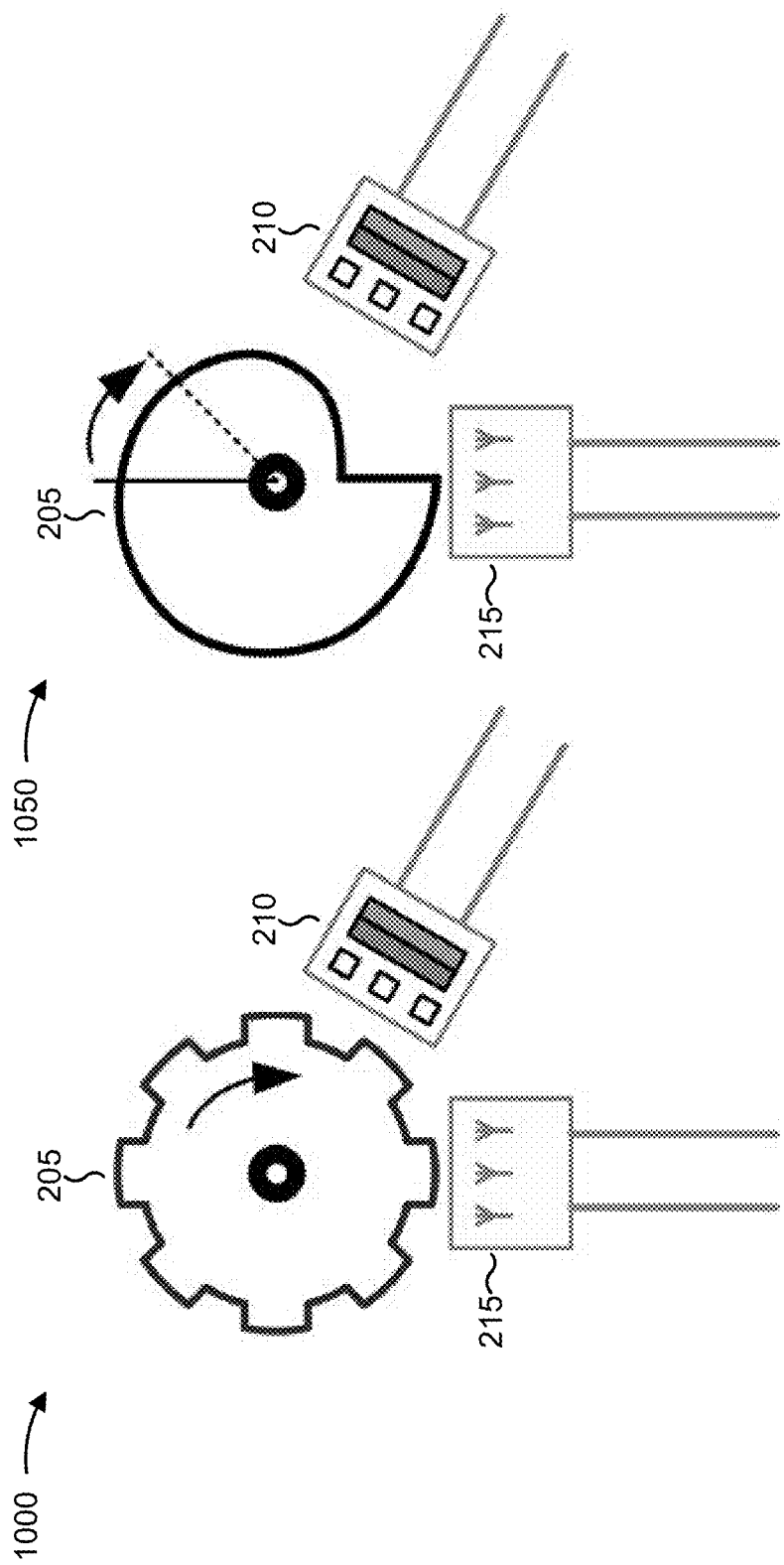

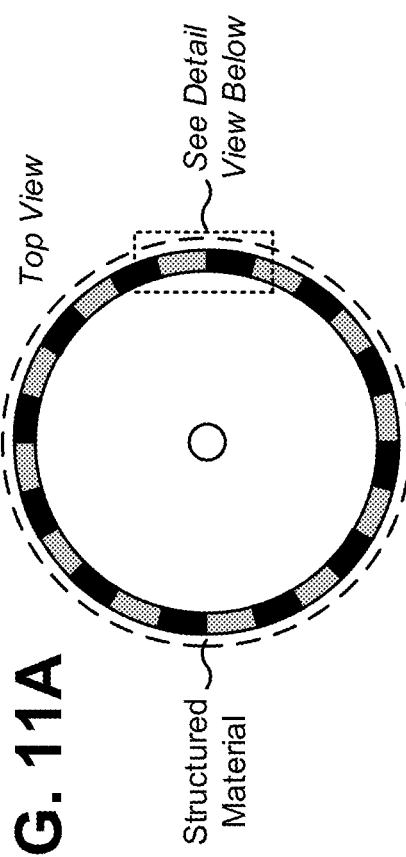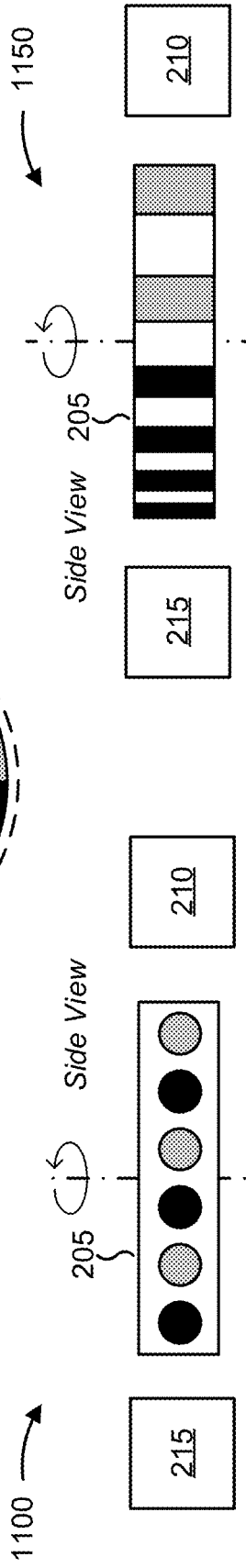

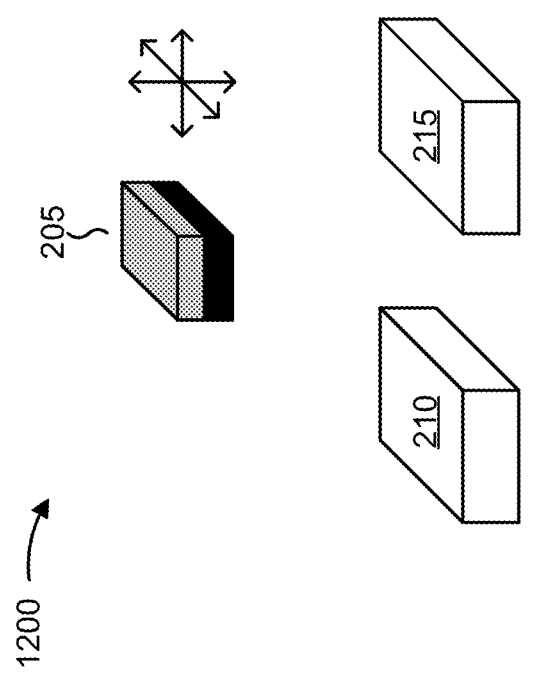

DIVERSE SENSING USING DIFFERENT TYPES OF SENSORS

BACKGROUND

A magnetic sensor may sense a magnetic field produced by or distorted by a target object. The magnetic sensor may output, based on the sensed magnetic field, a signal for use in identifying a position of the target object (e.g., an angular position, a linear position, a position in three-dimensional (3D) space), a direction of movement of the target object (e.g., a rotational direction, a direction of linear movement, a direction of movement in 3D space), a speed of the target object (e.g., a rotational speed, a linear speed, and/or the like), and/or the like.

A radar sensor may transmit a radar signal and may receive (at least a portion of) the radar signal after the radar signal is reflected by a target object. The radar sensor may output, based on the received radar signal, a signal for use in identifying a position of the target object, a direction of the target object, a speed of the target object, and/or the like.

SUMMARY

According to some possible implementations, a system may include: a magnetic sensor to measure a magnetic field that is influenced by a magnetic property of a target object, and determine first characteristic information, associated with the target object, based on the magnetic field; a radar sensor to measure a radar signal that is influenced by a radar property of the target object, and determine second characteristic information, associated with the target object, based on the radar signal; and a controller to determine a characteristic of the target object based on the first characteristic information and the second characteristic information.

According to some possible implementations, a method may include determining first characteristic information associated with a target object based on a magnetic field that is influenced by a magnetic property of the target object; determining second characteristic information associated with the target object based on a radar signal that is influenced by a radar property of the target object; and determining, based on the first characteristic information and the second characteristic information, whether a sensor system is working reliably.

According to some possible implementations, a sensor system may include a target object having a magnetic property and a radar property; a magnetic sensor configured to measure a magnetic field, and further configured to determine first characteristic information, associated with the target object, due to the target object influencing the magnetic field; a radar sensor configured to measure a radar signal and further configured to determine second characteristic information, associated with the target object, due to the target object influencing the radar signal; and a controller to monitor a movement of the target object based on the first characteristic information and the second characteristic information.

BRIEF DESCRIPTION OF THE DRAWINGS

FIGS. 6A and 6B, 7A-7C, 8, and 9A and 9B are diagrams illustrating example implementations of a sensor system including a target object with a non-constant axial thickness.

FIGS. 10A and 10B are diagrams illustrating top views of example implementations of a sensor system including a target object with a non-constant radial width.

FIGS. 11A-11E are diagrams illustrating side views of example implementations of sensor systems including a target object with a structured material on a surface of the target object.

FIG. 12 is a diagram illustrating an example implementation of a sensor system for use in a one-, two-, or three-dimensional environment.

DETAILED DESCRIPTION

Figure 1:
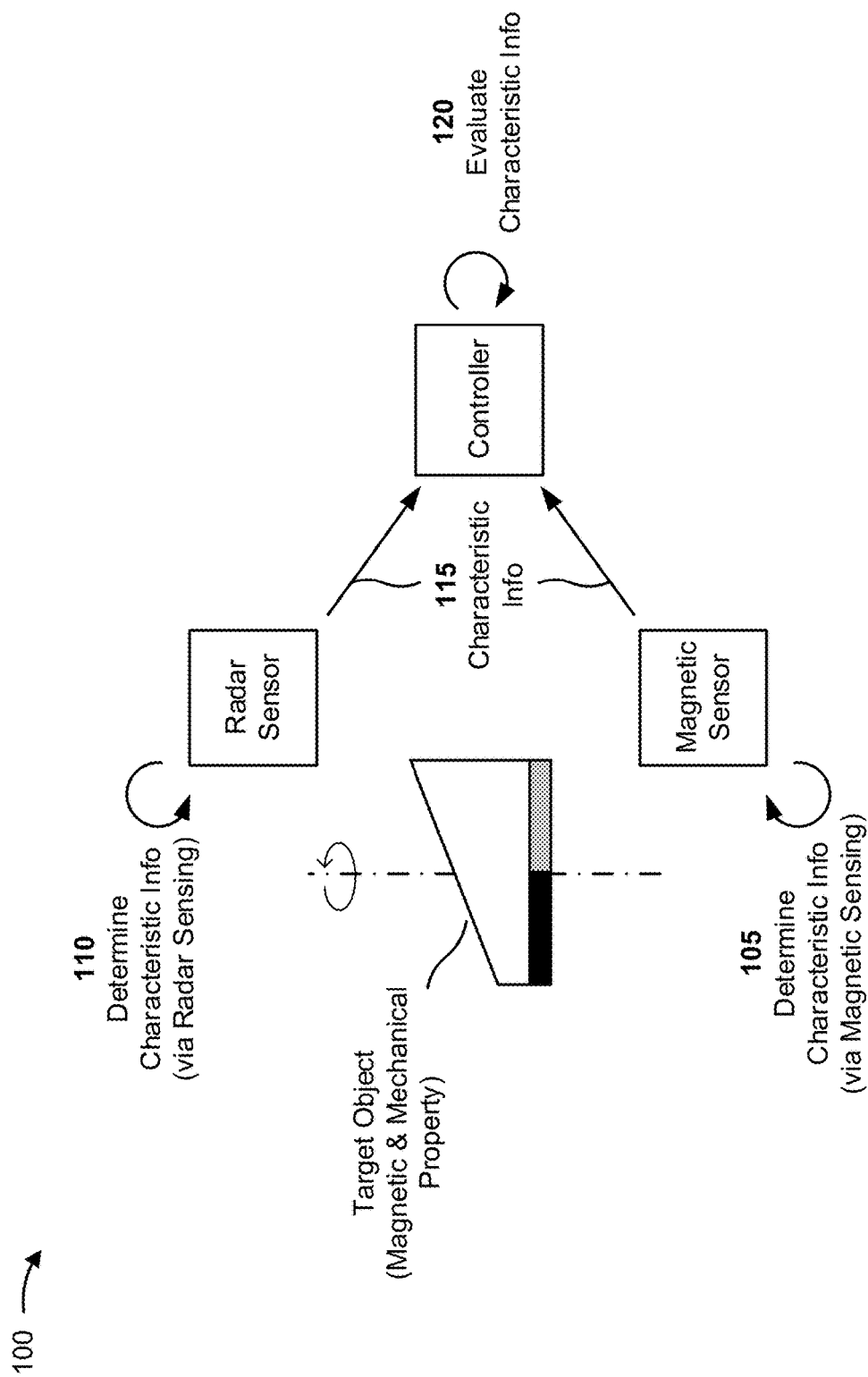
FIG. 1 is a diagram of an example implementation described herein.

The following detailed description of example implementations refers to the accompanying drawings. The same reference numbers in different drawings may identify the same or similar elements.

A magnetic sensor may be used to detect a characteristic of a target object (e.g., a position, a direction of movement, a speed of movement, whether the target object is moving or is at a stand-still, and/or the like). A number of setups exist that allow a signal, associated with identifying the characteristic, to be provided by a magnetic sensor. Many of these setups are used in automotive applications that are safety relevant, meaning that a fault associated with the magnetic sensor should be reliably detected, if not prevented (e.g., in order to prevent incorrect system decisions based on faulty sensor data). However, such a fault may not be reliably detected when the system includes a single magnetic sensor (e.g., since no redundancy is provided).

Some magnetic sensors are available in a dual channel version, which means that two magnetic sensors are implemented that are to deliver correlated signals (e.g., in order to provide redundancy). In such a case, if correlation of the signals is lost during operation, the system can determine that at least one of the magnetic sensors has experienced a fault. Unfortunately, in such cases, the magnetic sensors use the same measurement principle—magnetic field sensing— and, therefore, may deliver consistently correlated signals. Thus, the system may not be able to detect a fault when the fault impacts both magnetic sensors in the same way. Examples of such faults include loss or weakening of a sensed magnetic field, overlaid magnetic distortion fields, shielding or deflection of the magnetic field by a ferromagnetic part, and/or the like. Thus, even dual channel magnetic sensors may not reliably detect a fault, in some cases.

A radar sensor may also be used to detect a characteristic of a target object. A radar sensor uses a reflected radar signal (e.g., a millimeter wave (mm-wave) signal, a signal with a comparatively higher frequency than that of a magnetic field) to detect a distance, amplitude variation, frequency shift, phase shift or change of a polarization of the radar wave in order characterize the target object rotates and/or moves, and provides a signal based on which the characteristic of the target object can be identified. Thus, such radar sensors rely on reflection of the radar signal rather than relying on sensing a magnetic field (i.e., magnetic sensors and radar sensors rely on different measurement principles).

As such, an influence of a target object on each of these types of sensors depends on different properties of the target object. For example, in the case of the magnetic sensor, a magnetic field, sensed by the magnetic sensor, is influenced by a magnetic property of the target object (e.g., magnetic poles, a shape of a permanent magnet, a shape of a ferromagnetic portion of the target object, and/or the like). Conversely, in the case of the radar sensor, reflection and receipt of a radar signal is influenced by a mechanical or material property of the target object (herein referred to as a radar property) (e.g., a mechanical dimension or shape of a portion of the target object off of which the radar signal is to be reflected, a reflectivity of a portion of the target object off of which the radar signal is to be reflected, an absorption of a portion of the target object off of which the radar signal is to be reflected, and/or the like).

Some implementations described herein provide a system including a magnetic sensor and a radar sensor, both of which are arranged to provide respective signals associated with a characteristic of a target object. In some implementations, the magnetic sensor may determine information associated with the characteristic based on a magnetic field that is influenced by a magnetic property of the target object, while the radar sensor may determine information associated with the characteristic based on a radar signal that is influenced by a radar property of the target object. Thus, the magnetic sensor and the radar sensor may provide redundancy, associated with the determining the characteristic, based on which the system may detect a fault associated with the system.

Further, since the magnetic sensor and the radar sensor use different measurement principles, a fault may be readily identified in a number of fault scenarios. For example, operation of the magnetic sensor may be significantly affected by ferromagnetic particles that become affixed to or near a magnet that generates the magnetic field (e.g., by distorting the magnetic field as sensed by the magnetic sensor). However, such particles may not significantly impact reflection of a radar signal and, therefore, operation of the radar sensor may not be impacted. Therefore, comparing sensor signals may allow a fault associated with the magnetic sensor to be detected in such a case.

As another example, operation of both the magnetic sensor and the radar sensor may be affected by mechanical damage to the target object. However, due to the use of different sensing principles, it is likely that operation of the magnetic sensor and the radar sensor will be differently impacted by the mechanical damage. Therefore, comparing sensor signals may allow a fault associated with the target object to be detected in such a case.

As still another example, frequency ranges of possible distortion are different for the magnetic sensor and the radar sensor, and distortion spectra that simultaneously disturb both the magnetic sensor and the radar sensor are unlikely. As such, distortion in or near a frequency range of the magnetic field will not impact operation of the radar sensor, in which case comparing sensor signals may allow a fault associated with the magnetic sensor to be detected in such a case. Similarly, distortion in or near a frequency range of the radar signal will not impact operation of the magnetic sensor, in which case comparing sensor signals may allow a fault associated with the radar sensor to be detected in such a case. In a similar example, since electronics in the magnetic sensor and the radar sensor are inherently different, distortion of the sensor circuitry that leads to identical failure measurements is also unlikely.

As yet another example, a non-magnetic obstacle that enters in a measurement path between the radar sensor and the target object may partly or completely shield the reflection of the radar signal. However, the presence of such a non-magnetic obstacle will not shield the magnetic field from being sensed by magnetic sensor. Therefore, comparing sensor signals may allow a fault associated with the radar sensor to be detected in such a case.

As another example, water, if present in the system, may partially absorb a radar signal (e.g., such that the radar signal is not reflected back to the radar sensor). However, water does not remarkably influence the magnetic field as sensed by the magnetic sensor. Therefore, comparing sensor signals may allow a fault associated with the radar sensor to be detected in such a case.

FIG. 1 is a diagram of an example implementation 100 described herein. As shown in FIG. 1, a sensor system may include a target object, a magnetic sensor, a radar sensor, and a controller.

The target object is an object for which the magnetic sensor and the radar sensor are to determine a characteristic. The characteristic may include a position of the target object (e.g., an angular position, a linear position, a position in 3D space), a direction of movement of the target object (e.g., a rotational direction, a direction of linear movement, a direction of movement in 3D space), a speed of the target object (e.g., a rotational speed, a linear speed, and/or the like), and/or another characteristic of the target object.

As indicated in FIG. 1, the target object may have a magnetic property and a radar property. The magnetic property is a property of the target object that influences a magnetic field to be measured by the magnetic sensor. For example, the magnetic property may be magnetic poles of the target object, a shape of a permanent magnet portion of the target object, a shape of a ferromagnetic portion of the target object (e.g., when magnetic sensor 210 includes a back bias magnet), and/or the like, as shown and described in further detail in the examples below. The radar property is a property of the target object that influences a radar signal to be reflected back to the radar sensor. For example, the radar property may include a shape of a portion of the target object off of which the radar signal is to be reflected (whether ferromagnetic or not), a reflectivity of the target object, and/or the like, as shown and described in further detail in the examples below.

As shown in FIG. 1, and by reference number 105, the magnetic sensor may determine information associated with the characteristic based on measuring a magnetic field present at the magnetic sensor. Here, the magnetic field is influenced by the magnetic property of the target object, as described above.

As shown by reference number 110, the radar sensor may determine information associated with the characteristic based on transmitting a radar signal, and receiving the radar signal after reflection by the target object. Here, the receipt of the radar signal by the radar sensor is influenced by the radar property of the target object, as described above. In some implementations, the magnetic sensor and the radar sensor concurrently determine information associated with the characteristic (e.g., such that the information associated with the characteristic is determined by the magnetic sensor and the radar sensor at the same time, in other words, redundantly).

As shown by reference number 115, the magnetic sensor and the radar sensor may provide, to the controller, the information associated with the characteristic as determined by the magnetic sensor and the radar sensor, respectively.

As shown by reference number 120, the controller may evaluate the characteristic information in order to determine whether the information provided by the magnetic sensor matches the information provided by the radar sensor (e.g., within a defined threshold). In some implementations, if the controller determines that matching is not achieved (i.e., that the information provided by the magnetic sensor does not match the information provided by the radar sensor), then the controller may determine that the sensed information is not sufficiently reliable (e.g., until the characteristic information matching comes back within the threshold as the magnetic sensor and the radar sensor provide additional information to the controller). In some implementations, the controller, upon determining that the characteristic information does not match, can initiate a safety measure, such as deactivation of the sensor system; activation of a warning signal (e.g., to be used on a higher level); switching to a backup algorithm that does not require sensor information in association with controlling a system; limiting speed, force, or torque that is allowed for the application (e.g., depending on a degree of the mismatch); and/or the like.

In some implementations, the controller may determine whether a fault associated with the magnetic sensor, the radar sensor, and/or the target object, has occurred, and may provide an indication accordingly. For example, in some cases, another type of information may be available, such as an indication that a given sensor signal (e.g., a signal provided by the magnetic sensor or a signal provided by the radar sensor) is outside of a particular range (e.g. saturated), a warning indication delivered by a given sensor (e.g., based on a self-test performed by the given sensor), and/or the like. In this example, the controller may determine, based on the additional information and based on identifying the mismatching characteristic information, whether the fault is associated with the magnetic sensor, the radar sensor, and/or the target object.

Conversely, when the controller determines that the information provided by the magnetic sensor matches the information provided by the radar sensor (e.g., within the threshold), the controller may provide information associated with the characteristic of the target object (e.g., in association with controlling a system). As another example, the controller may determine whether a signal, provided by the magnetic sensor, is correlated with a signal provided by the radar sensor. Here, when the signals are correlated, the controller may determine that a fault is unlikely, and may provide information associated with the characteristic.

Here, since the magnetic sensor and the radar sensor operate based on different sensing principles, the magnetic sensor and the radar sensor may provide improved redundancy associated with the determining the characteristic (e.g., as compared to a system including a single channel or dual channel magnetic sensor), as described above.

As indicated above, FIG. 1 is provided merely as an example. Other examples are possible and may differ from what was described with regard to FIG. 1.

Figure 2:
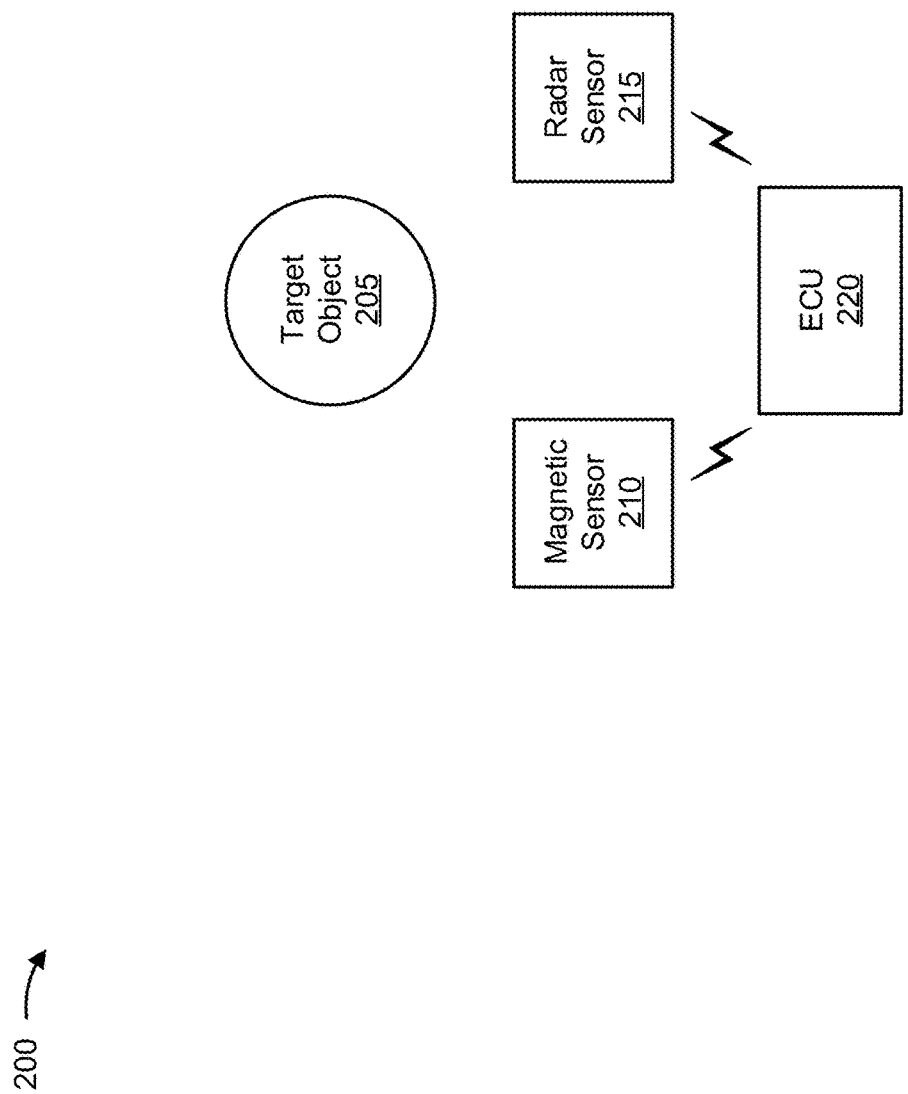
FIG. 2 is a diagram of an example sensor system in which systems and/or methods, described herein, may be implemented.

FIG. 2 is a diagram of an example sensor system 200 in which systems and/or methods, described herein, may be implemented. As shown in FIG. 2, sensor system 200 may include a target object 205, a magnetic sensor 210, a radar sensor 215, and an electronic control unit (ECU) 220.

Target object 205 includes an object for which the magnetic sensor and the radar sensor are to determine a characteristic. In some implementations, target object 205 may be attached to or coupled with an object for which a characteristic is to be measured, such as a cylindrical structure (e.g., a crankshaft, a camshaft, a shaft in an automated transmission, a rotating cylinder, etc.), a wheel structure (e.g., associated with a tire), an axle (e.g., a vehicle axle), a linearly moving object, an object that moves in 3D space, and/or the like. As described above, the characteristic may include a position of target object 205 (e.g., an angular position, a linear position, a position in 3D space), a direction of movement of target object 205 (e.g., a rotational direction, a direction of linear movement, a direction of movement in 3D space), a speed of target object 205 (e.g., a rotational speed, a linear speed, and/or the like), whether target object 205 is moving or is at a stand-still, and/or another characteristic of target object 205. Particular examples of possible implementations of target object 205 are described below.

In some implementations, target object 205 has a magnetic property that influences a magnetic field to be sensed by magnetic sensor 210. For example, the magnetic property may be magnetic poles of target object 205, a shape of a permanent magnet portion of target object 205, a shape of a ferromagnetic portion of target object 205, and/or the like.

In some implementations, target object 205 may include a permanent magnet that provides the magnetic property of target object 205. For example, target object 205 may include a permanent magnet comprising a first half forming a north pole (N) and a second half forming a south pole (S) (i.e., one pole pair), a dipole magnet (e.g., a dipole bar magnet, a circular dipole magnet, an elliptical dipole magnet, etc.), or another type of permanent magnet. As another example, target object 205 may include a magnetic pole wheel with at least two alternating poles (e.g., an encoding wheel with alternating N and S poles around a circumference). Thus, in some implementations, target object 205 may produce a magnetic field to be sensed by magnetic sensor 210. In some implementations, a magnet of target object 205 may have a square shape, a rectangular shape, a circular shape, an elliptical shape, a triangular shape, a ring shape, and/or the like.

In some implementations, target object 205 may include a ferromagnetic portion that provides the magnetic property of target object 205. For example, target object 205 may include a tooth wheel comprised of a ferromagnetic material (e.g., Iron or Permalloy). Here, target object 205 may distort a magnetic field of a back bias magnet (e.g., included in or arranged near magnetic sensor 210). In some implementations, target object 205 may include a symmetrical tooth wheel, an asymmetrical tooth wheel, a wheel with an asymmetrical shape, and/or the like.

In some implementations, target object 205 has a radar property that influences a radar signal to be reflected back to radar sensor 215. For example, the radar property may include a shape of a portion of target object 205 off of which the radar signal is to be reflected, a reflectivity of a surface of target object 205, and/or the like. In some implementations, the radar property of target object 205 influences the reflection of the radar signal by varying a distance from target object 205 to radar sensor 215 as target object 205 moves and/or rotates.

Magnetic sensor 210 includes a device capable of determining characteristic information associated with target object 205 based on sensing a magnetic field present at magnetic sensor 210. In some implementations, magnetic sensor 210 may include a magnetoresistive (MR) sensor, a Hall-effect sensor, a variable reluctance sensor (VRS), a fluxgate sensor, and/or the like. In some implementations, magnetic sensor 210 may be connected to ECU 220 such that magnetic sensor 210 may transmit a signal to ECU 220. The signal may include, or may be used to determine, characteristic information associated with target object 205 such as, information associated with a position of target object 205, information associated with a speed of target object 205, information associated with a direction of movement of target object 205, information associated with rotational angle of the target object 205, and/or the like. In some implementations, magnetic sensor 210 may include or may be arranged near a back bias magnet that produces a magnetic field to be distorted or influenced by target object 205. In some implementations, magnetic sensor 210 and radar sensor 215 may be included in the same sensor package and/or on the same sensor die. In some implementations, such an arrangement provides a precisely defined relative position of the sensors with respect to each other, which allows a comparatively more accurate evaluation of the signals in order to extract the measured characteristic information (e.g., since sensor placement inaccuracy is reduced significantly). Additional details regarding magnetic sensor 210 are described below with regard to FIG. 3.

Radar sensor 215 includes a device capable of determining characteristic information associated with target object 205 based on transmitting and receiving a radar signal. For example radar sensor 215 may be capable of determining characteristic information associated with target object 205 based on an evaluation of a distance between target object 205 and radar sensor 215 (e.g., based on a phase of a reflected radar signal) and/or an evaluation of a reflectivity of target object 205 (e.g., based on an amplitude of a reflected radar signal). In some implementations, such evaluations can be realized with a continuous wave (CW) radar signal, which may reduce cost of radar sensor 215 (e.g., as compared to a conventional radar sensor that uses a pulsed radar signal or a frequency modulated CW (FMCW) radar signal). In some implementations, radar sensor 215 may be connected to ECU 220 such that radar sensor 215 may transmit a signal to ECU 220. The signal may include, or may be used to determine, characteristic information associated with target object 205 such as, information associated with a position of target object 205, information associated with a speed of target object 205, information associated with a direction of movement of target object 205, and/or the like.

In some implementations, radar sensor 215 and magnetic sensor 210 may process signals differently and/or deliver signals in a different representation (e.g. radar sensor 215 may extract and deliver a continuous angle or linear position signal, and magnetic sensor 210 may extract and deliver an incremental sensor signal.

In some implementations, radar sensor 215 and magnetic sensor 210 may be included in the same sensor package and/or on the same sensor die. Additional details regarding radar sensor 215 are described below with regard to FIG. 4.

ECU 220 includes a device (e.g., a controller, one or more circuits, and/or the like) associated with determining characteristic information associated with target object 205, monitoring the characteristic (e.g., monitoring a movement) of target object 205 based on the characteristic information, and/or determining, based on the characteristic information, whether the characteristic information is reliable (e.g., based on comparing characteristic information provided by magnetic sensor 210 and characteristic information provided by radar sensor 215). In some implementations, ECU 220 may provide the characteristic information and/or initiate a safety measure in association with controlling one or more electrical systems and/or electrical subsystems. In some implementations, ECU 220 may be connected to magnetic sensor 210 such that ECU 220 may receive information (e.g., one or more signals) from magnetic sensor 210 via one or more transmission interfaces and/or via one or more output terminals. Similarly, ECU 220 may be connected to radar sensor 215 such that ECU 220 may receive information (e.g., one or more signals) from radar sensor 215 via one or more transmission interfaces and/or via one or more output terminals.

In some implementations, ECU 220 may be capable of calibrating, controlling, adjusting, and/or the like, the one or more electrical systems and/or electrical subsystems based on the information provided by magnetic sensor 210 and/or radar sensor 215. In some implementations, ECU 220 may include an electronic/engine control module (ECM), a powertrain control module (PCM), a transmission control module (TCM), a brake control module (BCM or EBCM), a central control module (CCM), a central timing module (CTM), a general electronic module (GEM), a body control module (BCM), a suspension control module (SCM), and/or another type of control module associated with a vehicle.

The number and arrangement of devices shown in FIG. 2 are provided as an example. In practice, there may be additional devices, fewer devices, different devices, or differently arranged devices than those shown in FIG. 2. Furthermore, two or more devices shown in FIG. 2 may be implemented within a single device, or a single device shown in FIG. 2 may be implemented as multiple, distributed devices. For example, while magnetic sensor 210 and radar sensor 215 are shown as separate devices in FIG. 2, in some implementations, magnetic sensor 210 and radar sensor 215 may be included in a single package, or even monolithically on the same die. Additionally, or alternatively, a set of devices (e.g., one or more devices) of sensor system 200 may perform one or more functions described as being performed by another set of devices of sensor system 200.

Figure 3:
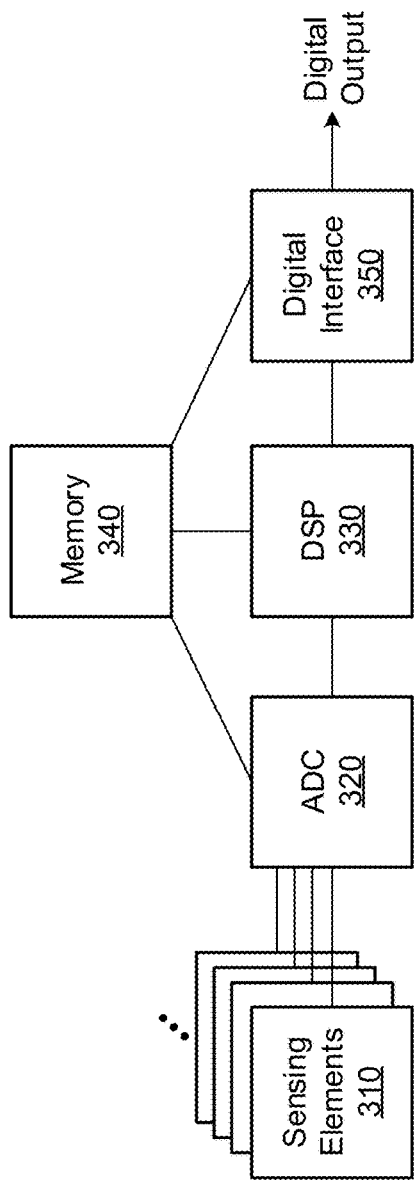
FIG. 3 is a diagram of example elements of a magnetic sensor included in the example environment of FIG. 2.

FIG. 3 is a diagram of example components of magnetic sensor 210. As shown, magnetic sensor 210 may include a set of sensing elements 310, an analog-to-digital convertor (ADC) 320, a digital signal processor (DSP) 330, an memory element 340, and a digital interface 350.

Sensing element 310 includes an element for sensing a component of a magnetic field present at sensing element 310. For example, sensing element 310 may include a Hall-based sensing element that operates based on a Hall-effect. As another example, sensing element 310 may include a MR-based sensing element, where the electrical resistance of the magnetoresistive material may depend on a strength and/or a direction of the magnetic field present at the magnetoresistive material. Here, sensing element 310 may operate based on an anisotropic magnetoresistance (AMR) effect, a giant magnetoresistance (GMR) effect, a tunnel magnetoresistance (TMR) effect, and/or the like. As an additional example, sensing element 310 may include a variable reluctance (VR) based sensing element that operates based on induction. In some implementations, magnetic sensor 210 may include multiple sensing elements 310 (e.g., two or more sensing elements 310).

In some implementations, one or more sensing elements 310 may be sensitive in a direction that is substantially perpendicular to a plane defined by a main surface (e.g., a top surface, a bottom surface) of magnetic sensor 210. Such a direction is referred to herein as a z-direction. Additionally, or alternatively, one or more sensing elements 310 may be sensitive in a direction that is substantially parallel to the plane defined by the main surface of magnetic sensor 210.

Such directions are referred to herein as an x-direction and/or a y-direction. In some implementations, two or more sensing elements 310 of magnetic sensor 210 may have a same direction of sensitivity. For example, a first sensing element 310 and a second sensing element 310 may both be sensitive in a same direction (e.g., the z-direction, the y-direction, or the x-direction).

ADC 320 may include an analog-to-digital converter that converts an analog signal from sensing elements 310 to a digital signal. For example, ADC 320 may convert analog signals, received from the set of sensing elements 310, into digital signals to be processed by DSP 330. ADC 320 may provide the digital signals to DSP 330. In some implementations, magnetic sensor 210 may include one or more ADCs 320.

DSP 330 may include a digital signal processing device or a collection of digital signal processing devices. In some implementations, DSP 330 may receive digital signals from ADC 320 and may process the digital signals to form output signals (e.g., destined for a control device to which magnetic sensor 210 is connected), such as output signals associated with an amount of current measured as passing through a current medium.

Memory element 340 may include a read only memory (ROM) (e.g., an EEPROM), a random access memory (RAM), and/or another type of dynamic or static storage device (e.g., a flash memory, a magnetic memory, an optical memory, etc.) that stores information and/or instructions for use by magnetic sensor 210. In some implementations, memory element 340 may store information associated with processing performed by DSP 330. Additionally, or alternatively, memory element 340 may store configurational values or parameters for the set of sensing elements 310 and/or information for one or more other elements of magnetic sensor 210, such as ADC 320 or digital interface 350.

Digital interface 350 may include an interface via which magnetic sensor 210 may receive and/or provide information from and/or to another device, such as ECU 220. For example, digital interface 350 may provide the output signal, determined by DSP 330, to ECU 220 and may further receive information from ECU 220.

The number and arrangement of components and elements shown in FIG. 3 are provided as an example. In practice, magnetic sensor 210 may include additional components and/or elements, fewer components and/or elements, different components and/or elements, or differently arranged components and/or elements than those shown in FIG. 3. Additionally, or alternatively, a set of components and/or a set of elements (e.g., one or more components or one or more elements) of magnetic sensor 210 may perform one or more functions described as being performed by another set of components or another set of elements of magnetic sensor 210.

Figure 4:
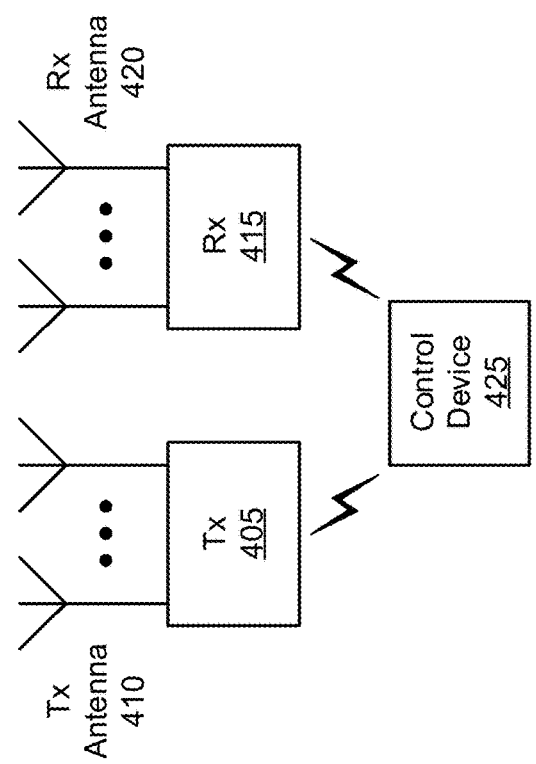
FIG. 4 is a diagram of example elements of a radar sensor included in the example environment of FIG. 2.

FIG. 4 is a diagram of example elements of radar sensor 215. As shown, radar sensor 215 may include a transmitter (Tx) 405, a set of transmit antennas (Tx antennas) 410, a receiver (Rx) 415, a set of receive antennas (Rx antennas) 420, and a control device 425.

Transmitter 405 includes a device capable of generating and transmitting an electrical signal (e.g., controlled by a signal received from control device 425), and transmitting the electrical signal to one or more transmit antennas 410. For example, transmitter 405 may include a solid state transmitter, or the like, that is capable of generating and/or transmitting an electrical signal to one or more transmit antennas 410.

In some implementations, transmitter 405 may include a power amplifier, a low-noise amplifier, a voltage controlled oscillator, and/or other circuitry for providing a time-varying signal to modulate the signal received from control device 425. In some implementations, transmitter 405 may be capable of being tuned to a radar frequency based on a signal received from control device 425.

Transmit antenna 410 includes a device capable of converting an electrical signal (e.g., received from transmitter 405) to a radar signal, and transmitting the radar signal (e.g., toward target object 205). For example, transmit antenna 410 may include a dipole antenna, a patch antenna, a horn antenna, a frequency-tunable antenna, and/or the like, that is capable of converting the electrical signal to a radar signal, and transmitting the radar signal. In some implementations, transmit antenna 410 may be a formed by metal wires, printed on a printed circuit board (PCB), integrated on an integrated circuit, integrated into a MEMS, integrated into a package of radar sensor 215, and/or the like. In some implementations, radar sensor 215 may include multiple transmit antennas 410. In some implementations, different transmit antennas 410 may be used for different frequency ranges that are selectable over high frequency switches.

Receiver 415 includes a component capable of receiving and/or processing an electrical signal (e.g., received from receive antenna 420), and providing the processed signal to control device 425. In some implementations, receiver 415 may include a power amplifier, a low-noise amplifier, a voltage controlled oscillator, and/or other circuitry for providing a time-varying signal to demodulate the signal received from receive antenna 420. In some implementations, receiver 415 may be capable of being tuned to a radar frequency based on a signal received from control device 425.

Receive antenna 420 includes a device capable of receiving a radar signal (e.g., transmitted by and reflected by target object 205), converting the radar signal to an electrical signal, and providing the electrical signal to receiver 415 for processing. For example, receive antenna 420 may include a dipole antenna, a patch antenna, a horn antenna, a frequency-tunable antenna, and/or the like, that is capable of converting the electrical signal to a radar signal, and transmitting the radar signal. In some implementations, receive antenna 420 may be a formed by metal wires, printed on a PCB, integrated on an integrated circuit, integrated into a MEMS, integrated into a package of radar sensor 215, and/or the like. In some implementations, radar sensor 215 may include multiple receive antennas 420. In some implementations, different receive antennas 420 may be used for different frequency ranges that are selectable over high frequency switches.

Control device 425 includes a device capable of controlling operation of radar sensor 215. For example, control device 425 may include a microcontroller, a microprocessor, a digital signal processor, an FPGA or the like. In some implementations, control device 425 may be capable of determining a characteristic of target object 205 based on information associated with a transmitted radar signal and information associated with a received radar signal corresponding to the transmitted signal. In some implementations, control device 425 may be capable of sending information associated with the characteristic of target object 205 to ECU 220.

The number and arrangement of components and elements shown in FIG. 4 are provided as an example. In practice, radar sensor 215 may include additional components (e.g., antenna multiplexers or directional couplers that allow the same antenna to be used for transmission and reception) and/or elements, fewer components and/or elements, different components and/or elements, or differently arranged components and/or elements than those shown in FIG. 4. Additionally, or alternatively, a set of components and/or a set of elements (e.g., one or more components or one or more elements) of radar sensor 215 may perform one or more functions described as being performed by another set of components or another set of elements of radar sensor 215.

Figure 5:
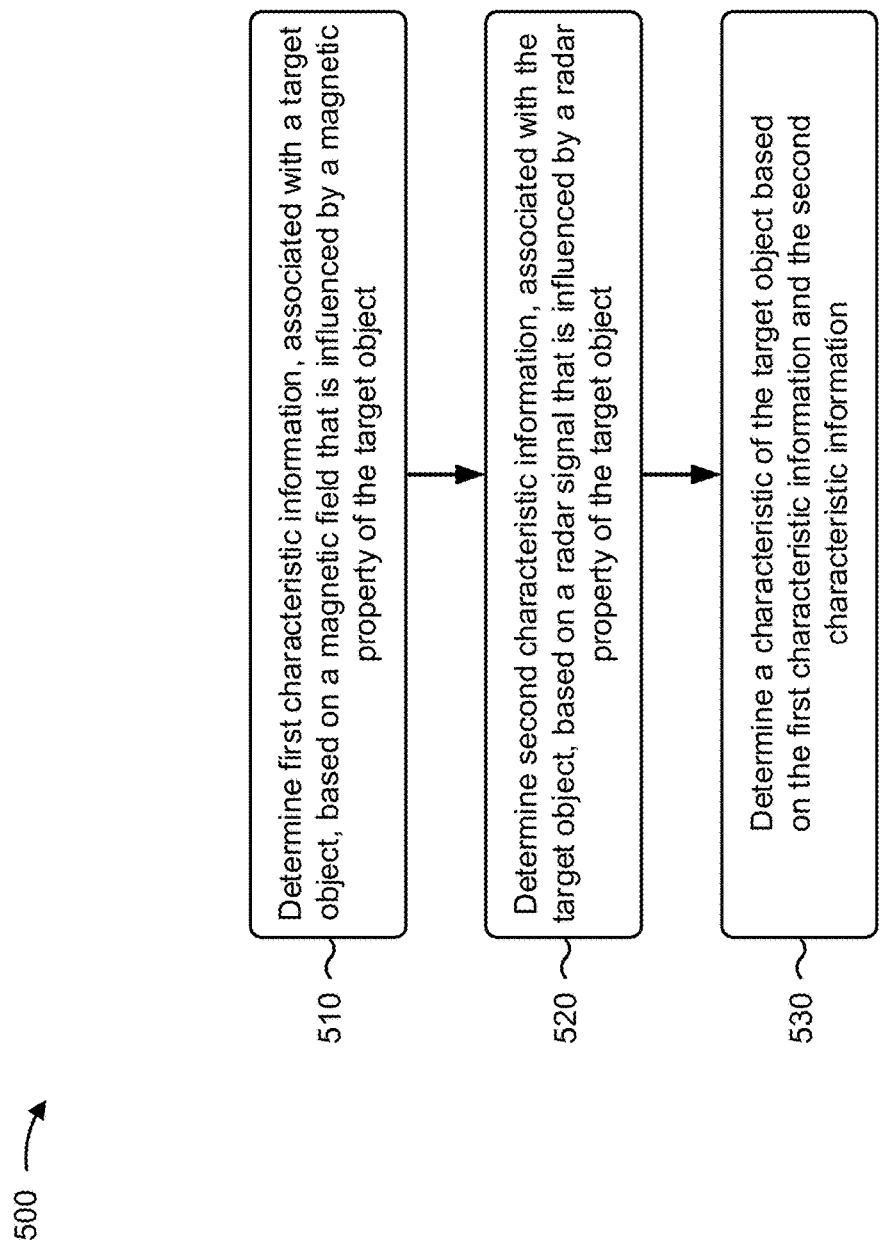
FIG. 5 is a flow chart of an example process for determining a characteristic of a target object based on redundant characteristic information provided by a magnetic sensor and a radar sensor.

FIG. 5 is a flow chart of an example process 500 for determining a characteristic of target object 205 based on redundant characteristic information provided by magnetic sensor 210 and radar sensor 215. In some implementations, one or more process blocks of FIG. 5 may be performed by one or more devices of sensor system 200.

As shown in FIG. 5, process 500 may include determining first characteristic information, associated with a target object, based on a magnetic field that is influenced by a magnetic property of the target object (block 510). For example, sensor system 200 (e.g., magnetic sensor 210) may determine first characteristic information, associated with target object 205, based on a magnetic field that is influenced by a magnetic property of target object 205, as described above.

As further shown in FIG. 5, process 500 may include determining second characteristic information, associated with the target object, based on a radar signal that is influenced by a radar property of the target object (block 520). For example, sensor system 200 (e.g., radar sensor 215) may determine second characteristic information (e.g., redundant characteristic information), associated with target object 205, based on a radar signal that is influenced by a radar property of target object 205, as described above.

As further shown in FIG. 5, process 500 may include determining a characteristic of the target object based on the first characteristic information and the second characteristic information (block 530). For example, sensor system 200 (e.g., ECU 220) may determine a characteristic of target object 205 based on the first characteristic information and the second characteristic information, as described above.

In some implementations, the magnetic property of target object 205 is at least one of: an arrangement of magnetic poles of target object 205, a shape of a permanent magnet portion of target object 205, or a shape of a ferromagnetic portion of target object 205.

In some implementations, the radar property of target object 205 is at least one of: a mechanical dimension or shape of a portion of target object 205 off of which the radar signal is to be reflected, a reflectivity of the portion of target object 205 off of which the radar signal is to be reflected, or an absorption of the portion of target object 205 off of which the radar signal is to be reflected.

In some implementations, the radar property of target object 205 is a non-constant axial thickness of target object 205 in a direction that is substantially parallel to an axis of rotation of target object 205.

In some implementations, the radar property of the target object is a non-constant radial width of target object 205 in a direction that is substantially perpendicular to an axis of rotation of target object 205.

In some implementations, the radar property of target object 205 is a structured material on a surface of target object 205.

In some implementations, magnetic sensor 210 is a first magnetic sensor 210, and sensor system 200 may include a second magnetic sensor 210, arranged at an offset angle from the first magnetic sensor 210. The second magnetic sensor 210 may determine third characteristic information, associated with target object, based on another magnetic field that is influenced by the magnetic property of target object 205. Here, the offset angle between the first magnetic sensor 210 and the second magnetic sensor 210 introduces a phase difference between signals associated with the first magnetic sensor 210 and the second magnetic sensor 210.

In some aspects, radar sensor 215 is a first radar sensor 215 and the radar signal is a first radar signal, and sensor system 200 may include a second radar sensor 215. The second radar sensor 215 may determine third characteristic information, associated with target object 205, based on another radar signal that is influenced by the radar property of target object 205.

In some implementations, the first characteristic information and the second characteristic information are associated with a position of target object 205. In some implementations, the first characteristic information and the second characteristic information are associated with a direction of movement of target object 205. In some implementations, the first characteristic information and the second characteristic information are associated with a speed of target object 205.

In some implementations, magnetic sensor 210 and radar sensor 215 are included in a same sensor package or are on a same sensor die.

In some implementations, ECU 220 may be further configured to determine whether the first characteristic information matches the second characteristic information; and determine whether sensor system 200 is sufficiently reliable based on whether the first characteristic information matches the second characteristic.

Although FIG. 5 shows example blocks of process 500, in some implementations, process 500 may include additional blocks, fewer blocks, different blocks, or differently arranged blocks than those depicted in FIG. 5. Additionally, or alternatively, two or more of the blocks of process 500 may be performed in parallel.

In some implementations, target object 205 has a magnetic property (to influence a magnetic field at magnetic sensor 210) and a radar property (to influence a radar signal to be received by radar sensor 215), as described above. In some implementations, the radar property of target object 205 is a non-constant axial thickness of target object 205 in a direction that is substantially parallel to an axis of rotation of target object 205. FIGS. 6A and 6B, 7A-7C, 8, and 9A and 9B are diagrams illustrating example implementations of sensor system 200 including target object 205 with a non-constant axial thickness.

Figure 6B:
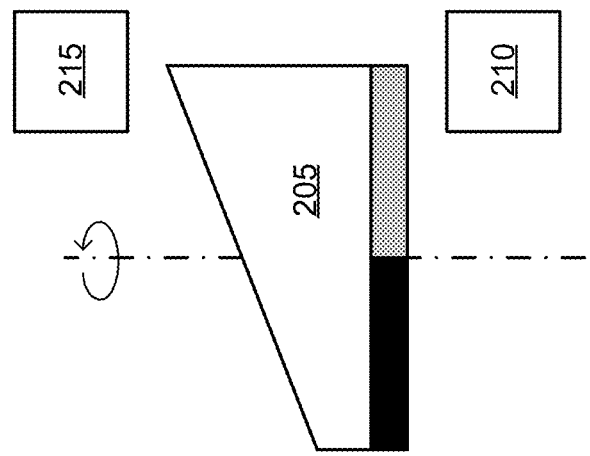
Figure 6A:
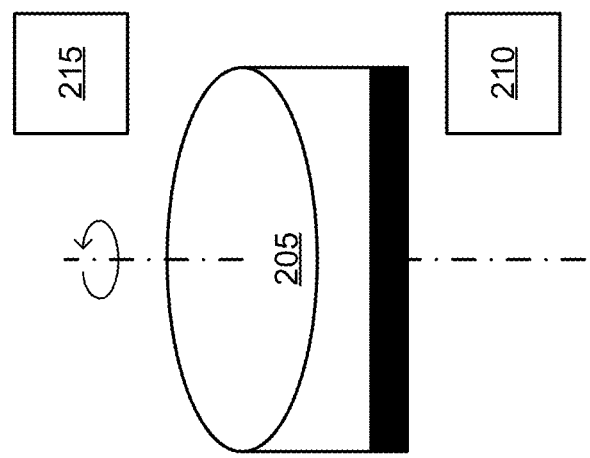

FIGS. 6A and 6B are a front view and a side view, respectively, of an example implementation 600 of sensor system 200 including target object 205 with a non-constant axial thickness. As shown in FIGS. 6A and 6B, target object 205 may have a ramped circular shape such that an axial thickness of target object 205 is non-constant. In this example, the ramped circular portion of target object 205 does not comprise magnetic material. Here, as target object 205 rotates about an axis of rotation (identified by a dashed and dotted line), a distance from target object 205 to radar sensor 215 changes. In other words, the distance between target object 205 and radar sensor 215 depends on an angular position of target object 205. As such, a radar signal, transmitted by radar sensor 215, is influenced by the radar property of target object 205 (e.g., since a phase and an amplitude of a radar signal reflected back to radar sensor 215 depends on the distance and the reflectively, respectively), and radar sensor 215 can determine information associated with a characteristic of target object 205 (e.g., an angular position, a direction of rotation, a rotational speed, and/or the like), accordingly.

As further shown in FIGS. 6A and 6B, target object 205 may include a permanent magnet (e.g., a ring magnet, a disc magnet) with two magnetic poles, each covering approximately 180° of a circumference of target object 205. Here, as target object 205 rotates about the axis of rotation, a magnetic field strength at magnetic sensor 210 changes. In other words, the magnetic field present at magnetic sensor 210 depends on an angular position of target object 205. Thus, the magnetic field at magnetic sensor 210 is influenced by the magnetic property of target object 205, and magnetic sensor 210 can determine information associated with the characteristic of target object 205, accordingly.

As indicated above, FIGS. 6A and 6B are provided merely as examples. Other examples are possible and may differ from what was described with regard to FIGS. 6A and 6B.

Figure 7A:
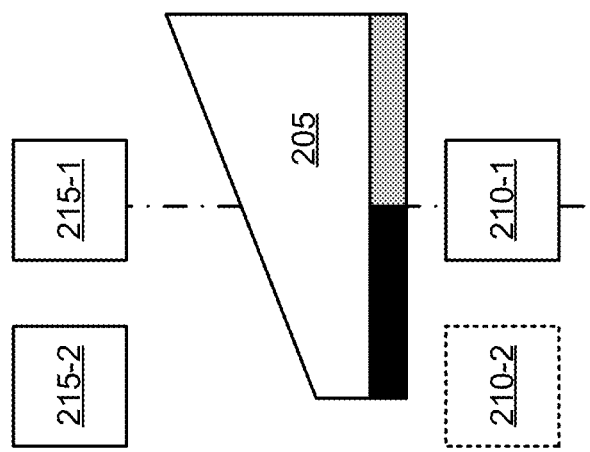
Figure 7B:
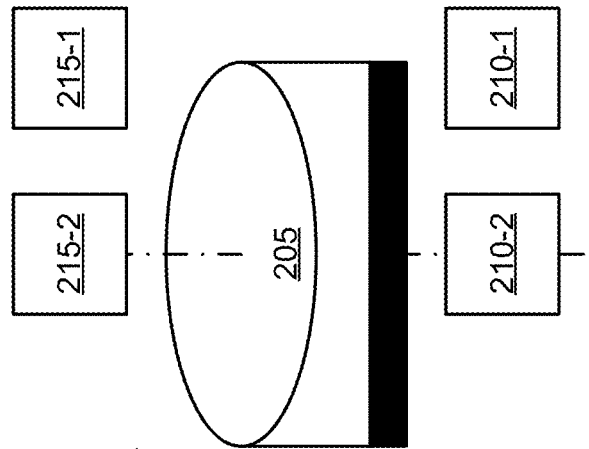
Figure 7C:
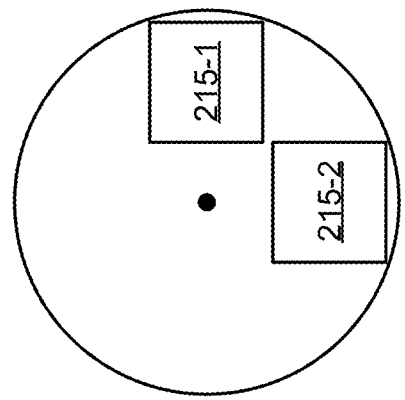

FIGS. 7A-7C are a front view and a side view, respectively, of an example implementation 700 of sensor system 200 including target object 205 with a non-constant axial thickness. As shown in FIGS. 7A-7C, sensor system 200 may include two radar sensors 215 (e.g., radar sensor 215-1 and radar sensor 215-2) and/or two magnetic sensors 210 (e.g., magnetic sensor 210-1 and magnetic sensor 210-2). In example implementation 700, target object 205 may have a magnetic property and a radar property similar to that described above in association with FIGS. 6A and 6B.

In this example, sensor system 200 can achieve a 180° unambiguous angular range (e.g., since each type of sensor has two measurement points). In some implementations, an offset angle between the two radar sensors 215 and/or the two magnetic sensors 210 may be approximately 90° (e.g., in order to provide a highest possible angle resolution for a given signal to noise ratio). However, the offset angle may be at angle other than 90°, in some implementations (e.g., in order to allow integration of a given pair of sensors in the same package or a single chip). In some implementations, sensor system 200 may include two radar sensors 215 and a single magnetic sensor 210. Alternatively, sensor system 200 may include two magnetic sensors 210 and a single radar sensor 215, in some cases. In some implementations, both types of sensors (magnetic and radar) may be placed with angular offsets. Alternatively, in some cases, only one of type of sensor (magnetic or radar) may be placed with an angular offset. In some implementations, with respect to magnetic sensor 210, two orthogonal field components may be measured in order to achieve a 360° resolution (e.g., with GMR or TMR or vertical Hall sensors) instead of measuring the same field component in a 90° shifted position.

As indicated above, FIGS. 7A-7C are provided merely as examples. Other examples are possible and may differ from what was described with regard to FIGS. 7A-7C.

FIG. 8 is a side view of example implementation 800 of sensor system 200 including target object 205 with a non-constant axial thickness. As shown in FIG. 8, target object 205 may have a ramped circular shape such that an axial thickness of target object 205 is non-constant (similar to that described above in association with FIGS. 6A and 6B). However, in example implementation 800, the ramped circular portion of target object 205 is formed from a permanent magnet. In other words, in some cases, a permanent magnet may be formed to provide the radar property of target object 205 that is to influence the radar signal.

As indicated above, FIG. 8 is provided merely as an example. Other examples are possible and may differ from what was described with regard to FIG. 8.

FIGS. 9A and 9B are a front view and a side view, respectively, of example implementation 900 of sensor system 200 including target object 205 with a non-constant axial thickness. As shown in FIG. 9A, target object 205 may include a ramped shape that changes the distance between target object 205 and radar sensor 215 unambiguously over 360°. As shown, in this example, target object 205 may include a step (e.g., such that after a full rotation, the distance between target object 205 and radar sensor 215 changes instantaneously from a shortest distance to a longest distance). In some implementations, the step may define a maximum amplitude that can be used for calibrating radar sensor 215. Here, as target object 205 rotates about an axis of rotation, a distance from target object 205 to radar sensor 215 changes. In other words, the distance between target object 205 and radar sensor 215 depends on an angular position of target object 205. As such, a radar signal, transmitted by radar sensor 215, is influenced by the radar property of target object 205, and radar sensor 215 can determine information associated with a characteristic of target object 205, accordingly.

As further shown in FIGS. 9A and 9B, target object 205 may include a multi-pole magnetic stripe (e.g., an encoder wheel rather than a two pole magnet) on a circumference of target object 205. Here, the magnetic field present at magnetic sensor 210 depends on an angular position of target object 205. Thus, the magnetic field at magnetic sensor 210 is influenced by the magnetic property of target object 205, and magnetic sensor 210 can determine information associated with the characteristic of target object 205, accordingly. As shown, example implementation 900 may utilize a top-read magnetic sensor 210 or a side-read magnetic sensor 210.

As indicated above, FIGS. 9A and 9B are provided merely as examples. Other examples are possible and may differ from what was described with regard to FIGS. 9A and 9B.

In some implementations, the radar property of target object 205 is a non-constant radial width of target object 205 in a direction that is substantially perpendicular to an axis of rotation of target object 205. For example, target object 205 may comprise a ferromagnetic material with a non-constant radial width. FIGS. 10A and 10B are top views of example implementations 1000 and 1050, respectively, of sensor system 200 including target object 205 with a non-constant radial width. FIG. 10A illustrates sensor system 200 including target object 205 in the form of a tooth wheel formed from a ferromagnetic material. FIG. 10B illustrates sensor system 200 including target object 205 in the form of an object, formed from a ferromagnetic material, that is shaped such that a distance between target object 205 and radar sensor 215 changes unambiguously over a full rotation of target object 205.

As shown, in example implementation 1000 or 1050, magnetic sensor 210 may include or be arranged near a back bias magnet such that a magnetic field, present at magnetic sensor 210, is influenced by target object 205 (e.g., such that the magnetic field strength at magnetic sensor 210 changes as target object 205 rotates). Thus, magnetic sensor 210 may determine information associated with a characteristic of target object 205 based on the magnetic field influenced by target object 205. Further, a distance between the surface of target object 205 and radar sensor 215 changes during rotation as a result of the non-constant radial width of target object 205. Thus, radar sensor 215 may determine (redundant) information associated with the characteristic based on a radar signal that is reflected at a surface of target object 205. Further, with regard to example implementation 1050, the arrangement of radar sensor 215 and magnetic sensor 210 (e.g., in different positions with respect to target object 205) assures that a signal discontinuity, resulting from the step in the radial width of target object 205, does not appear in the same rotational position and, thus, at least one sensor should be capable of tracing the angular change continuously.

As indicated above, FIGS. 10A and 10B are provided merely as examples. Other examples are possible and may differ from what was described with regard to FIGS. 10A and 10B.

In some implementations, the radar property of target object 205 may be a structured material on a surface of target object 205. FIGS. 11A-11E are various views of example implementations 1100 and 1150, respectively, of sensor systems 200 including target object 205 with a structured material on a surface of target object 205.

As shown in FIGS. 11A-11E, in some implementations, target object 205 may include a permanent magnet with an edge surface that is covered by a structured material. Here, the structured material may change reflection of a radar signal by varying a distance between radar sensor 215 and target object 205 (e.g., due to the thickness of the structured material in areas where the structured material is present). The structured material may include, for example, a ring of non-magnetic material (e.g., aluminum) with holes, a polymer that is mechanically structured using a coating process (e.g., a photoresist), and/or the like.

In some implementations, the structured material may match a magnetic structure of target object 205 (e.g., such that each pole of target object 205 is exposed by a hole in the structured material, as shown in example implementation 1100). Alternatively, the structured material may not match a magnetic structure of target object 205 (e.g., such that differently sized portions of a given pole of target object 205 are exposed by areas in which the structured material is not present, as shown in example implementation 1150). In some implementations, the structured material can be regularly patterned (e.g., as shown in example implementation 1100) or irregularly patterned (e.g., as shown in example implementation 1150).

As indicated above, FIGS. 11A-11E are provided merely as examples. Other examples are possible and may differ from what was described with regard to FIGS. 11A-11E.

In some implementations, sensor system 200 may be configured to determine information associated with a characteristic in a one-, two-, or three-dimensional environment. For example, magnetic sensor 210 may include linear magnetic field sensors or 3D Hall sensors (e.g., multiple linear magnetic field channels with different sensitive directions), and radar sensor 215 may include a set of antennas for determining a distance in one, two, or three dimensions. In some implementations, in a two-dimensional or three-dimensional setup, radar sensor 215 may include arrays of distributed antennas to detect a direction towards target object 205 (e.g. using the phase mono-pulse principle or the amplitude mono-pulse principle).

FIG. 12 is a diagram illustrating example implementation 1200 of sensor system 200 for use in a one-, two-, or three-dimensional environment. Notably, in example implementation 1200, target object 205 may include a permanent magnet of any shape (e.g., a square magnet is shown in FIG. 12). As indicated above, FIG. 12 is provided merely as an example. Other examples are possible and may differ from what was described with regard to FIG. 12.

Some implementations described herein provide a system including a magnetic sensor and a radar sensor, both of which are arranged to provide respective signals associated with a characteristic of a target object. In some implementations, the magnetic sensor may determine information associated with the characteristic based on a magnetic field that is influenced by a magnetic property of the target object, while the radar sensor may determine information associated with the characteristic based on a radar signal that is influenced by a radar property of the target object. Thus, the magnetic sensor and the radar sensor may provide redundancy associated with the determining the characteristic.

The foregoing disclosure provides illustration and description, but is not intended to be exhaustive or to limit the implementations to the precise form disclosed. Modifications and variations are possible in light of the above disclosure or may be acquired from practice of the implementations.

Even though particular combinations of features are recited in the claims and/or disclosed in the specification, these combinations are not intended to limit the disclosure of possible implementations. In fact, many of these features may be combined in ways not specifically recited in the claims and/or disclosed in the specification. Although each dependent claim listed below may directly depend on only one claim, the disclosure of possible implementations includes each dependent claim in combination with every other claim in the claim set.

No element, act, or instruction used herein should be construed as critical or essential unless explicitly described as such. Also, as used herein, the articles "a" and "an" are intended to include one or more items, and may be used interchangeably with "one or more." Furthermore, as used herein, the term "set" is intended to include one or more items (e.g., related items, unrelated items, a combination of related items, and unrelated items, etc.), and may be used interchangeably with "one or more." Where only one item is intended, the term "one" or similar language is used. Also, as used herein, the terms "has," "have," "having," or the like are intended to be open-ended terms. Further, the phrase "based on" is intended to mean "based, at least in part, on" unless explicitly stated otherwise.

What is claimed is:

1. A system, comprising:
  a magnetic sensor to:
    measure a magnetic field that is influenced by a magnetic property of a target object, and
    determine first characteristic information, associated with the target object, based on the magnetic field;
  a radar sensor to:
    measure a radar signal that is influenced by a radar property of the target object, and
    determine second characteristic information, associated with the target object, based on the radar signal; and
  a controller to determine a characteristic of the target object based on the first characteristic information and the second characteristic information.

2. The system of claim 1, wherein the magnetic property of the target object is at least one of:
  an arrangement of magnetic poles of the target object,
  a shape of a permanent magnet portion of the target object,
  or a shape of a ferromagnetic portion of the target object.

3. The system of claim 1, wherein the radar property of the target object is at least one of:

a mechanical dimension or shape of a portion of the target object off of which the radar signal is to be reflected,
a reflectivity of the portion of the target object off of which the radar signal is to be reflected, or
an absorption of the portion of the target object off of which the radar signal is to be reflected.

4. The system of claim 1, wherein the radar property of the target object is a non-constant axial thickness of the target object in a direction that is substantially parallel to an axis of rotation of the target object.

5. The system of claim 1, wherein the radar property of the target object is a non-constant radial width of the target object in a direction that is substantially perpendicular to an axis of rotation of the target object.

6. The system of claim 1, wherein the radar property of the target object is a structured material on a surface of the target object.

7. The system of claim 1, wherein the magnetic sensor is a first magnetic sensor,
wherein the sensor system further comprises a second magnetic sensor, arranged at an offset angle from the first magnetic sensor, to:
measure another magnetic field that is influenced by the magnetic property of the target object; and
determine third characteristic information, associated with the target object, based on the other magnetic field,
wherein the offset angle between the first magnetic sensor and the second magnetic sensor introduces a phase difference between signals associated with the first magnetic sensor and the second magnetic sensor.

8. The system of claim 1, wherein the radar sensor is a first radar sensor and the radar signal is a first radar signal,
wherein the sensor system further comprises a second radar sensor to:
measure another radar signal that is influenced by the radar property of the target object, and
determine third characteristic information, associated with the target object, based on the other radar signal.

9. The system of claim 1, wherein the first characteristic information and the second characteristic information are associated with a position of the target object.

10. The system of claim 1, wherein the first characteristic information and the second characteristic information are associated with a direction of movement of the target object.

11. The system of claim 1, wherein the first characteristic information and the second characteristic information are associated with a speed of the target object.

12. The system of claim 1, wherein the magnetic sensor and the radar sensor are included in a same sensor package.

13. The system of claim 1, wherein the magnetic sensor and the radar sensor are on a same sensor die.

14. The system of claim 1, wherein the controller is further configured to:
determine whether the first characteristic information matches the second characteristic information; and
determine whether the system is sufficiently reliable based on whether the first characteristic information matches the second characteristic.

15. A method, comprising:
determining first characteristic information associated with a target object based on a magnetic field that is influenced by a magnetic property of the target object;
determining second characteristic information associated with the target object based on a radar signal that is influenced by a radar property of the target object; and
determining, based on the first characteristic information and the second characteristic information, whether a sensor system is working reliably.

16. The method of claim 15, wherein the magnetic property of the target object is at least one of:
an arrangement of magnetic poles of the target object,
a shape of a permanent magnet portion of the target object,
or a shape of a ferromagnetic portion of the target object.

17. The method of claim 15, wherein the radar property of the target object is at least one of:
a mechanical dimension or shape of a portion of the target object off of which the radar signal is to be reflected,
a reflectivity of the portion of the target object off of which the radar signal is to be reflected, or
an absorption of the portion of the target object off of which the radar signal is to be reflected.

18. The method of claim 15, wherein the radar property of the target object is:
a non-constant axial thickness of the target object in a direction that is substantially parallel to an axis of rotation of the target object,
a non-constant radial width of the target object in a direction that is substantially perpendicular to an axis of rotation of the target object, or
a structured material on a surface of the target object.

19. The method of claim 15, wherein the first characteristic information and the second characteristic information are associated with at least one of:
a position of the target object,
a direction of movement of the target object, or
a speed of the target object.

20. A sensor system, comprising:
a target object having a magnetic property and a radar property;
a magnetic sensor configured to measure a magnetic field, and further configured to determine first characteristic information, associated with the target object, due to the target object influencing the magnetic field;
a radar sensor configured to measure a radar signal and further configured to determine second characteristic information, associated with the target object, due to the target object influencing the radar signal; and
a controller to monitor a movement of the target object based on the first characteristic information and the second characteristic information.

* * * * *